US007135238B2

(12) United States Patent
Raybould et al.

(10) Patent No.: US 7,135,238 B2
(45) Date of Patent: Nov. 14, 2006

(54) ELEVATED TEMPERATURE OXIDATION PROTECTION COATINGS FOR TITANIUM ALLOYS AND METHODS OF PREPARING THE SAME

(75) Inventors: Derek Raybould, Denville, NJ (US);
Paul Chipko, Blairstown, NJ (US);
William E. Fischer, Stanhope, NJ (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/977,260

(22) Filed: Oct. 29, 2004

(65) Prior Publication Data
US 2005/0058849 A1 Mar. 17, 2005

Related U.S. Application Data

(63) Continuation of application No. 10/077,307, filed on Feb. 15, 2002, now Pat. No. 6,855,212.

(51) Int. Cl.
*B32B 15/04* (2006.01)
*B32B 15/00* (2006.01)
*B32B 7/10* (2006.01)

(52) U.S. Cl. .............. 428/651; 428/629; 428/660; 428/926; 427/328; 427/383.1

(58) Field of Classification Search .............. 428/632; 148/281
See application file for complete search history.

(56) References Cited

U.S. PATENT DOCUMENTS

| 4,024,303 | A | | 5/1977 | Hahn |
| 4,692,385 | A | * | 9/1987 | Johnson ................ 428/469 |
| 4,933,239 | A | | 6/1990 | Olson et al. |
| 5,281,484 | A | | 1/1994 | Tank et al. |
| 5,300,159 | A | | 4/1994 | Petzoldt et al. |
| 5,672,436 | A | | 9/1997 | Tobin |
| 6,146,075 | A | | 11/2000 | Delangis |
| 6,670,050 | B1 | * | 12/2003 | Raybould et al. .......... 428/651 |
| 6,855,212 | B1 | * | 2/2005 | Raybould et al. .......... 148/240 |

FOREIGN PATENT DOCUMENTS

WO  WO 98/54531  5/1998
WO  WO-98/54531 A1 * 12/1998

* cited by examiner

*Primary Examiner*—Jennifer C. McNeil
*Assistant Examiner*—Jason L. Savage
(74) *Attorney, Agent, or Firm*—Oral Caglar, Esq.

(57) ABSTRACT

Oxidation protection of a titanium-based alloy is provided with improved fatigue properties by a titanium aluminide coating of between 2 to 12 microns by diffusing the Al into the Ti at a temperature below the melting point of the Al. The coating is gas deposited and protects the titanium-based alloys from oxidation at high temperature utilization.

15 Claims, 6 Drawing Sheets

MICROGRAPH OF COATED TITANIUM FOIL AFTER A HEAT TREATMENT BELOW THE MELTING POINT OF ALUMINUM

MICROGRAPH OF COATED TITANIUM FOIL AFTER A HEAT TREATMENT BELOW THE MELTING POINT OF ALUMINUM

US 7,135,238 B2

ELEVATED TEMPERATURE OXIDATION PROTECTION COATINGS FOR TITANIUM ALLOYS AND METHODS OF PREPARING THE SAME

CROSS-REFERENCE TO RELATED APPLICATIONS

This application is a continuation of U.S. patent application Ser. No. 10/077,307, filed on Feb. 15, 2002, now U.S. Pat. No. 6,855,212, hereby incorporated by reference.

BACKGROUND OF THE INVENTION

The present invention relates to heat exchangers. More specifically, the present invention relates to oxidation protection of titanium-based heat exchangers, with improved fatigue properties.

Certain heat exchangers used in aircraft environmental control systems are exposed to temperatures exceeding 400° C. These heat exchangers are typically made of stainless steel or nickel based alloys such as Inconnel, which can withstand the high temperatures.

It would be desirable to use titanium heat exchangers instead of stainless steel heat exchangers. Titanium and its alloys have a lightweight and can provide a weight reduction of up to 40% over comparable stainless steel heat exchangers. The weight reduction results in better fuel efficiency and lower aircraft operating costs.

However, titanium is not used for high temperature heat exchanger applications because the titanium exhibits a propensity to rapidly oxidize, (over a couple of hours), at the required operating temperatures. Oxidation of titanium results in a reduction in ductility and then strength, and a deterioration in structural integrity. Repeated thermal cycling at temperatures between ambient temperature and around 400° C. (and higher) causes the titanium to crack. Cross contamination of fluids can occur and lead to life-threatening conditions.

Accordingly, it has been proposed to provide an oxidation protective coating to the exposed titanium-based surfaces of the heat exchanger. The coating may be a titanium aluminide coating. The coatings and thermal cycles are compatible with the titanium alloy and also the brazes used to join the Ti. It also provides protection to the braze, which can be more prone to oxidation than the Ti. Oxidation of the braze would enbrittel the joint and lead to oxidation of the Ti. Not only does the titanium aluminide provide oxidation protection, but it is able to withstand the different thermal stresses due to thermal cycling set up by either titanium or a braze clad titanium, because of their good bonding to the base titanium and braze plus their high strength. The braze and titanium have different coefficients of thermal expansion so locally at the junction between braze clad and titanium the coating may be subject to high strains and stresses. In addition, the coatings do not reduce the heat exchanger efficiency by reducing the gas flow through the passageways. Neither do they reduce the heat transfer though the titanium; i.e. they do not thermally insulate the titanium that they protect from oxidation.

Moreover, the coatings maintain adequate strength and ductility in the titanium, which allows the heat exchanger to handle structural forces occurring in high temperature heat transfer applications.

In many vehicles and especially in an aircraft there are high pressures and temperature cycling and vibrations from the surrounding environment (e.g., the aircraft engine on which the heat exchanger is attached). The protective coating must therefore also maintain adequate fatigue properties in the material it is protecting. It is however well known that most coatings reduce the fatigue life of material they are protecting. For instance, anodizing of aluminum is a well-known method of protecting aluminum, but it also reduces the fatigue life of the aluminum. This is usually referred to as the fatigue debit. For most coatings there is a need and desire to reduce the magnitude of this fatigue debit and ideally to eliminate it.

The TiAl protective coatings for titanium also have a fatigue debit and as would be expected there is a desire to reduce this debit. Especially as aircraft heat exchangers are usually used in an environment, which is subjected to high fatigue loads, there is a need therefore to improve the fatigue characteristic of the coating and reduce the debit it has on the fatigue properties of the Ti.

SUMMARY OF THE INVENTION

In accordance with one aspect of the invention, a method of coating a titanium based surface to provide oxidation protection at elevated temperatures comprises applying a protective coating to the surface, the protective coating having an aluminum conversion layer applied at a temperature below which aluminum does not appreciably react with titanium and of a thickness of less than about 15 microns; and heat treating the conversion layer so the aluminum oxidizes and interacts with the titanium to form titanium aluminide.

In accordance with another aspect of the invention, a method of applying a coating to a titanium-based substrate comprises applying an aluminum conversion layer of between about 2 to 12 microns on the substrate by gaseous deposition, the layer being deposited at a temperature below which aluminum does not appreciably react with titanium and below the melting point of aluminum; heat treating the aluminum conversion layer so the aluminum oxidizes to form alumina and interacts with the titanium to form the titanium aluminide; and the aluminum conversion layer is oxidized to form an alumina surface layer.

In yet another aspect of the invention, a method of coating a titanium based surface to provide oxidation protection at elevated temperatures comprises cleaning the titanium-based surface; applying a protective coating to the surface, the coating being applied by applying an aluminum conversion layer to the surface at a temperature below which aluminum does not appreciably react with titanium and of a thickness of less than 12 microns; and then heat treating the conversion layer so the aluminum oxidizes and interacts with the titanium to form titanium aluminide.

In a still further aspect of the present invention, an oxidation protective coating for a titanium-based alloy surface comprises a heat-treated aluminum conversion layer applied to the titanium-based alloy surface and having a thickness of less than 12 microns.

In accordance with yet another aspect of the invention, a method of applying a coating to a braze for titanium, which may contain depending on the braze alloy a substantial amount of Ti, only trace amounts of Ti, or in some cases no Ti, comprises applying an aluminum conversion layer of between about 2 to 12 microns on the substrate preferably by gaseous deposition, the layer being deposited at a temperature below which aluminum does not appreciably react with titanium or the braze and below the melting point of Al; heat treating the aluminum conversion layer so the aluminum oxidizes to form alumina and interacts with the braze either to form titanium aluminide or a solid state solution diffusing into the braze leaving an alumina surface layer.

These and other features, aspects and advantages of the present invention will become better understood with reference to the following drawings, description and claims.

DETAILED DESCRIPTION OF THE INVENTION

Figure 1:
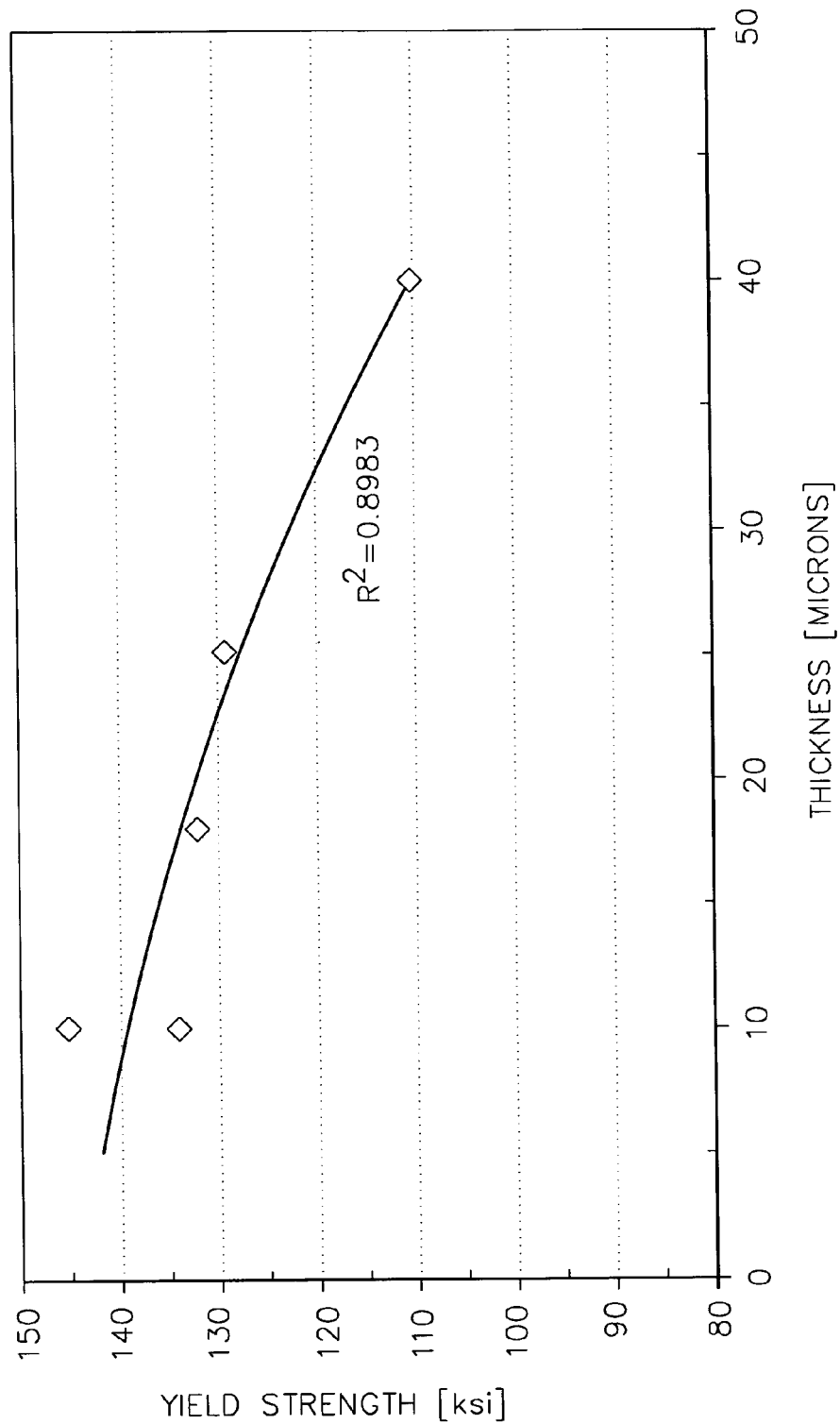
FIG. 1 is a graph of the protection thickness effect on tensile strength of a typical titanium alloy foil.

The following detailed description is of the best currently contemplated modes of carrying out the invention. The description is not to be taken in a limiting sense, but is made merely for the purpose of illustrating the general principles of the invention, since the scope of the invention is best defined by the appended claims.

The term titanium and Ti is used in the text herein to indicate conventional titanium alloys ranging from pure titanium to alpha, alpha+beta, and beta titanium alloys.

In general, the present invention provides a titanium aluminide oxidation protective coating that may be applied to a titanium-based alloy or a braze for titanium, which depending on the braze alloy may be based on Ti or may contain no Ti. The coating can applied by applying an aluminum conversion layer to the titanium alloy or braze at temperature below which aluminum does not appreciably react with titanium and of a thickness of less than about 12 microns, and then heat treating the conversion layer so that the aluminum oxidizes and interacts with the titanium to form titanium aluminide. A further step can include cleaning the titanium-based alloy surface prior to aluminum deposition. The surface may be cleaned with a dilute caustic solution of KOH, and the aluminum conversion layer is transformed to titanium aluminide by heating at a controlled rate below about 630° C. after cleaning the surface.

More particularly, and in accordance with the present invention, oxidation protection of a titanium-based alloy or braze can be provided by a titanium aluminide coating of between about 2 to 12 microns by diffusing the Al into the Ti at a temperature below the melting point of the Al. Preferably, the coating is gas deposited, but other techniques may also be used which coat the Ti at low temperatures (e.g., less than about 550° C.), such as roll bonding, electroplating, ion vapor deposition, chemical vapor deposition or physical vapor deposition. The coating can protect the titanium-based surface and the braze surface from oxidation at high temperature utilization (e.g., about 750° C.). The fatigue factor for the protective coating may be reduced by making the TiAl layer as thin as possible (e.g., about 2 to 15 microns) and the strength of the resultant coating may be increased by controlling the diffusion temperature (e.g., about 600 to 650° C.).

The coated assembly may then be heat treated (e.g., in a vacuum furnace) to activate the conversion coating and transform the aluminum into titanium aluminide with an alumina surface upon heat treatment. The aluminum can oxidize to form alumina and interact with the titanium to form the titanium aluminide. The heating and cooling rates may be controlled to avoid cracking the titanium aluminide. Cracking of the titanium aluminide coating is of concern, as it can result in oxidation of the titanium in the cracked area. As oxygen diffuses quickly in titanium, a single crack can result in the oxidation of a complex heat exchanger part.

Specifically, the aluminum conversion layer may be transformed to titanium aluminide by heating at a slow controlled rate above about 500° C. up to about 750° C., followed by a short hold, and cooling at a controlled slow rate down to about 500° C. For example, heating may be at about 25 to 100° C. per hour after 500° C. followed by about 15 to 120 minutes hold, and the cooling rate is also around 15 to 60° C. per hour down to about 500° C. The heat treatment may be performed under vacuum to around 700° C. with a hold of about 5 to 120 minutes.

The diffusion of aluminum and transformation of titanium to titanium aluminide preferably occurs at temperatures around 700° C. A conversion layer having a thickness in the range of about 0.5 to 40 microns could produce a titanium aluminide coating having a thickness between about 1 to 80 microns.

Left over from the low temperature heating is a surface layer of alumina on the titanium aluminide. The alumina surface layer also provides oxidation protection. The thickness of the alumina surface layer may be between about 0.5 microns to 5 microns.

Heat treatment of the protective coating results in an oxidation resistant coating that can protect the titanium from oxidation and embrittlement even after exposure for 4,000 hours at 700° C. The resultant coating provides oxidation resistance up to around 800° C.

Because the gaseous deposition technique of the present invention is performed at low temperatures (i.e., about 200 to 300° C.), it has several advantages over conventional techniques such as PVD, CVD and in-the-pack and above-the-pack techniques. The conventional techniques involve temperatures (typically about 1,000° C.) that would destroy the mechanical properties of the titanium due to grain growth or over-aging, depending on the temperature and alloy. The conventional techniques would also open up the possibility of oxidation of unprotected titanium, even if the process occurs in a vacuum. In addition, conventional techniques involve temperatures above or close to that of the melt temperature of titanium brazes (typically about 900° C.). Erosion is a common problem with titanium; it is indicative of too high a braze temperature or too long a time at high temperatures. Even temperatures of about 800° C. could lead to a non-optimum coating and result in erosion and metallurgical problems due to excessive diffusion. In addition, excessive distortion of the complex shape of the heat exchanger would occur, with leaks forming between passages.

Deposition of the aluminum at too high a temperature prevents the formation of the surface alumina layer. Deposition at the elevated temperature results in the diffusion of the aluminum into the titanium during coating so afterwards there is no aluminum to oxidize to alumina. Hence, protection would only be provided by titanium aluminide and not by the titanium aluminide and alumina layer.

Elevated temperature protection against oxidation is required for titanium alloys to be used at high temperatures. An excellent TiAl protective coating was described in U.S. Pat. No. 6,670,050, issued on Dec. 30, 2003, assigned to the same assignee as the present invention, but as with nearly all coatings there is a reduction in fatigue life associated with it (i.e., fatigue debit).

The fatigue debit from the TiAl protection may be reduced by making the TiAl layer as thin as possible. Approximately 2 microns is thought to be the minimum useful thickness, but it is impossible with the gaseous deposition technique used to obtain such a thin coating and ensure that all the part is coated. Therefore, the coating should be as thin as possible, and as determined by the invention, less than about 12 microns. In addition, it was surprisingly found that careful control of the temperature at which diffusion of the Al into the Ti occurs increases strength and, more importantly, increases fatigue life by a factor of 2 or the limit by +5 ksi for the most sensitive case, very thin 4 mil Ti foil. This may be because the effective thickness of the TiAl layer is reduced, but the temperature difference is so small it is unlikely to affect the amount of diffusion. Also the type of TiAl phases changes as the diffusion temperature is decreased, but over the lower temperature range the TiAl phases do not change, while the fatigue properties improve as the temperature is decreased in this range. Surprisingly, the optimum temperature range is below the melting point of Al, which was thought to be the minimum temperature for transformation of the Al to TiAl.

As noted above, one aspect of the invention involves applying the aluminum conversion coating as a gaseous phase at a temperature below which aluminum does not appreciably react (i.e., around 550° C.) with titanium or melt the braze (about 800° C.). The gaseous deposition may be performed at temperatures below 300° C. An advantage of using gas as a carrier is that the gas flows throughout the heat exchanger at a low pressure and velocity. As a result, heat exchanger surfaces designed to create turbulent gas flow and surfaces at which have stagnant flow areas are all uniformly coated, and other hard-to-reach surfaces within the heat exchanger are uniformly coated. Thus, the gaseous deposition results in a conversion coating that is applied with a uniform thickness, even if the heat exchanger has a complex geometry.

As stated, the mechanical properties, of an oxidation protected, Al coated titanium alloy, especially the fatigue life of the resultant coated part may be increased by ensuring that the Al coating is thin, such as less than about 12 micron, but optimally at least around 2 micron in order to achieve some protection.

EXAMPLE 1

Titanium foil 4 mil thick was selected for an evaluation of coating thickness because the effect of the coatings properties is much more pronounced on the thin foil than thick sections. Thin foil is also required for heat exchangers, with it being formed into the fins. The foil was machined to tensile and fatigue specimens with care being taken not to damage the edges of the foil. These were then degreased prior to being coated with aluminum of various thicknesses. The vapor deposition technique was chosen to deposit the aluminum and a deposition temperature of 300° C. was used. The thickness of the aluminum conversion layer was varied form 5 to 40 microns by adjusting the specimen locations within the coating chamber and by carrying out additional runs for a longer duration. After deposition of the aluminum conversion layer, the specimens were heat-treated —firstly at a low temperature, ~400° C., to from an alumina layer on the surface and then at a high temperature, 700° C., to diffuse the remaining Al into the Ti to form a titanium aluminide. The aluminum conversion layer may be deposited on the titanium-based substrate at a temperature of less than about 450° C.

The tensile strength of the specimens was determined using standard equipment. The thin coatings of around 10 μm gave strengths similar to those of the uncoated material, while the thicker coatings decreased strength, despite the reported very high strength of TiAl compared to conventional titanium alloys as shown in FIG. 1. (For the graphs in the Figures, curve fitting has been used to add trend lines in order to better understand and illustrate the data. The trend lines were plotted using least squares fit. The R squared value indicated on the graph shows the closeness of the trend-lines fit to the data, with a value of one being the best possible fit.)

Figure 2:
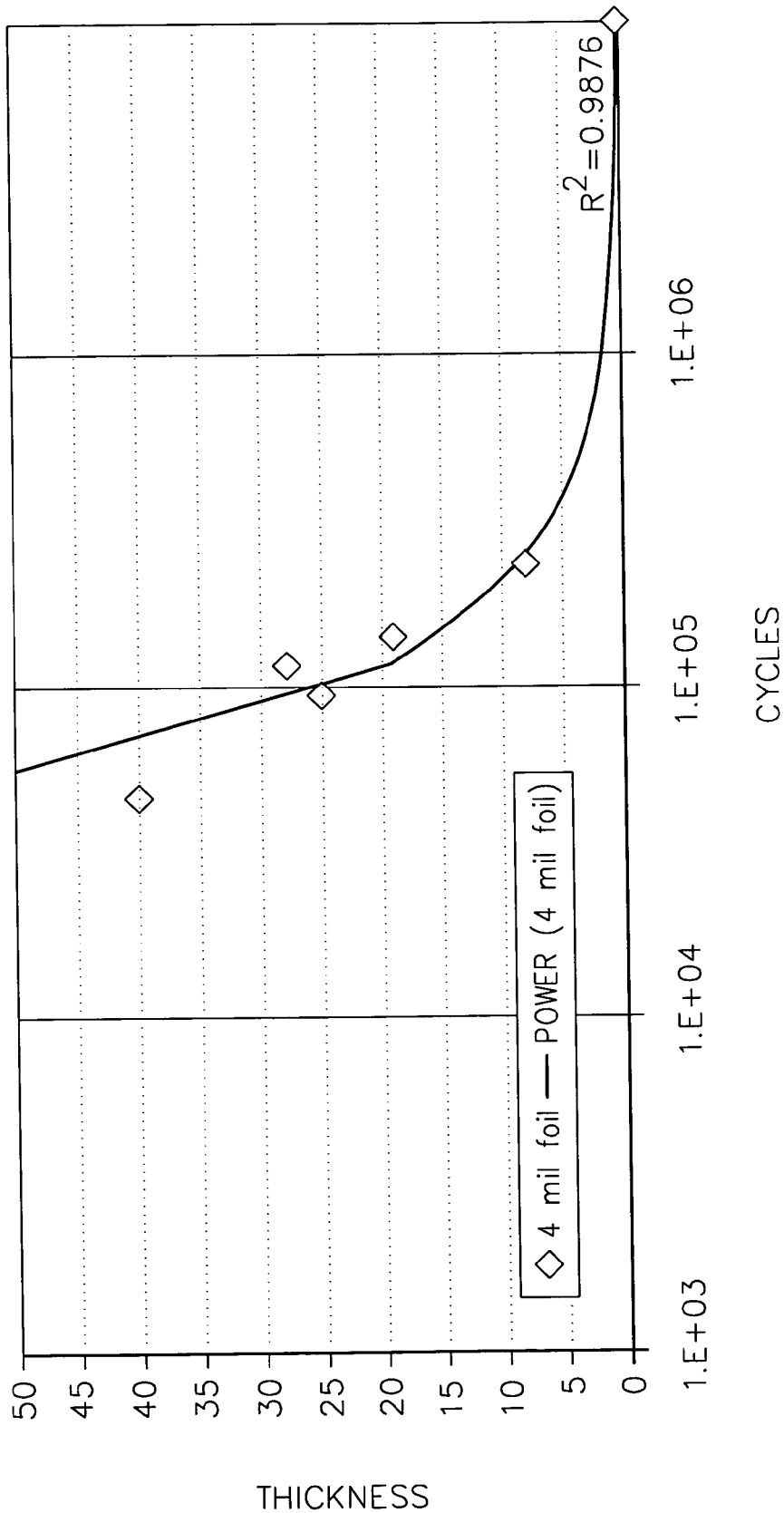
FIG. 2 is a graph of the protection thickness effect on fatigue of a typical titanium alloy foil.

The fatigue specimens were tested using an alternating axial stress at an R ratio of 0.1 and a frequency of 50 Hz. A stress level was chosen by exploratory work, which would result in failure in a reasonable time, i.e., we did not want the stress to be so low that all the specimens did not fail or that failure only occurred after weeks of testing for each specimen. Similarly, we did not want the stress to be so high that failure occurred effectively at the same time for all the specimens. The exploratory work suggested a level of 35 ksi would be a good compromise. The thinner coatings gave the longest lives with the maximum being obtained with a 2–5 μm coating as shown in FIG. 2.

It is realized that while a coating of ~2.0 μm would be optimum for a actual part, especially one as complex as an heat exchanger, the coating thickness could not be controlled to that accuracy and an average coating thickness of ~7 μm would be required to ensure that all of the part was coated.

EXAMPLE 2

Using the information from Example 1 a series of specimens was coated with a uniform thickness of ~7 μm. These were prepared the same way as described in Example 1, but the maximum temperature during heat treatment was varied from 550 to 1000° C.

X-ray analysis showed that the type of titanium aluminde formed depended on temperature and that at the high temperatures, ~1,000° C., used for other Al coating techniques, such as above the pack or conventional CVD the titanium aluminde phase was $Ti_3Al$; in addition the alumina phase was reduced compared to low temperatures, 700 & 800° C. This was despite the same low temperature oxidation step being carried out for all the specimens. For the Al deposition techniques which require these elevated temperatures and have no low temperature oxidation step, this reduction in the amount of alumina formed will be even greater as the Al that is deposited will quickly completely diffuse into the Ti at these temperatures.

At higher temperatures, X-ray showed a mixture of titanium aluminides are formed, but at ~700° C. and below only $TiAl_3$ was present plus a significant amount of alumina.

Further investigation of the effect of the maximum transformation temperature on mechanical properties was carried out, but as the titanium aluminde phase in the coating and percentage of alumina remained stable it was not expected to show any difference in properties between ~700° C. down to 660° C., the melting point of Al, below which the Al coating was not expected to transform to titanium aluminde except at rates which were too slow to be of interest.

Surprisingly, the tensile strength and fatigue life of the specimens were found to continue to increase as the temperature decreased below ~700° C. and even more surprisingly below the melting point of Al.

Figure 3:
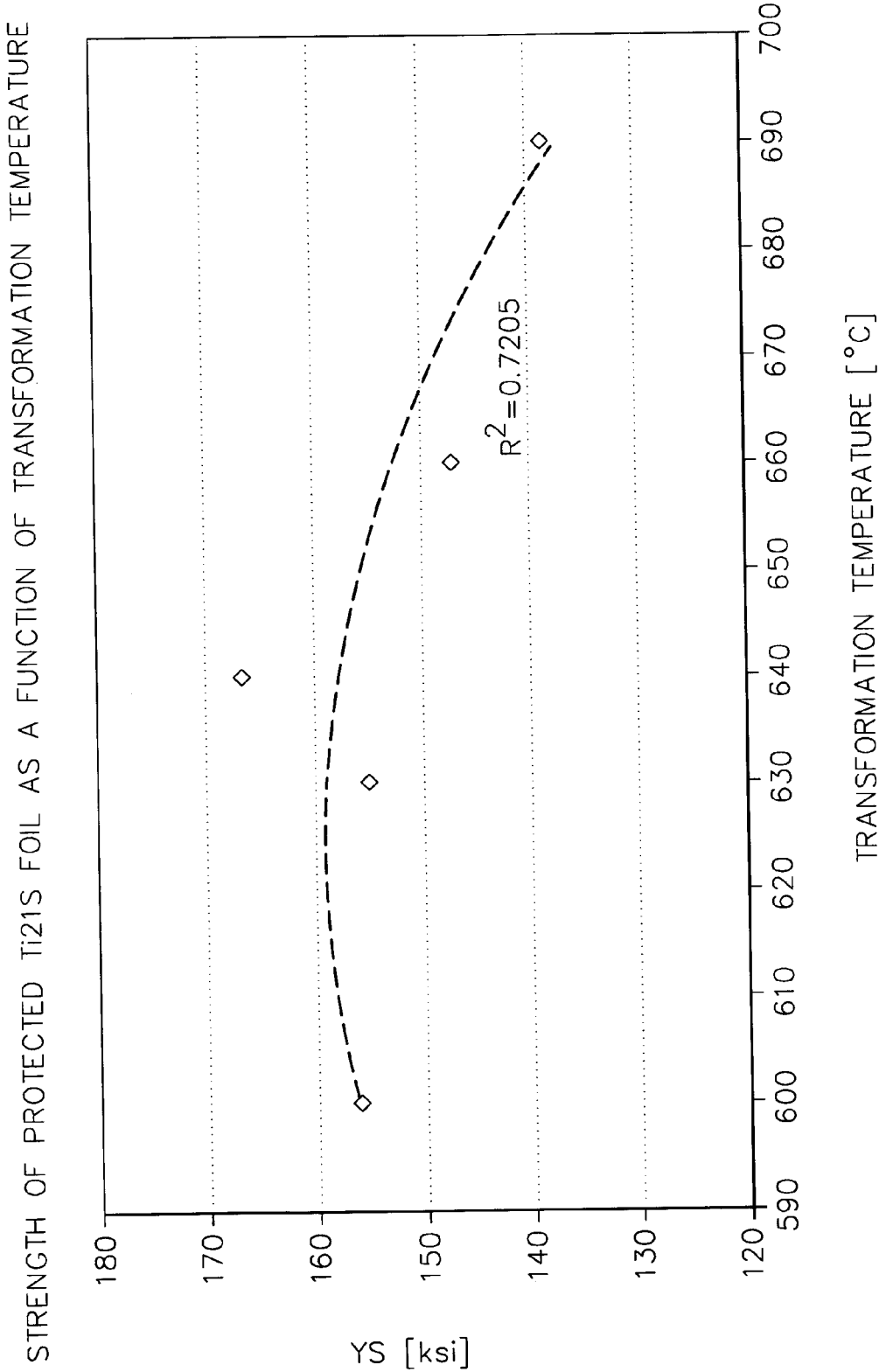
FIG. 3 is a graph of protected titanium alloy foil as a function of transformation temperature in accordance with the present invention.
Figure 4:
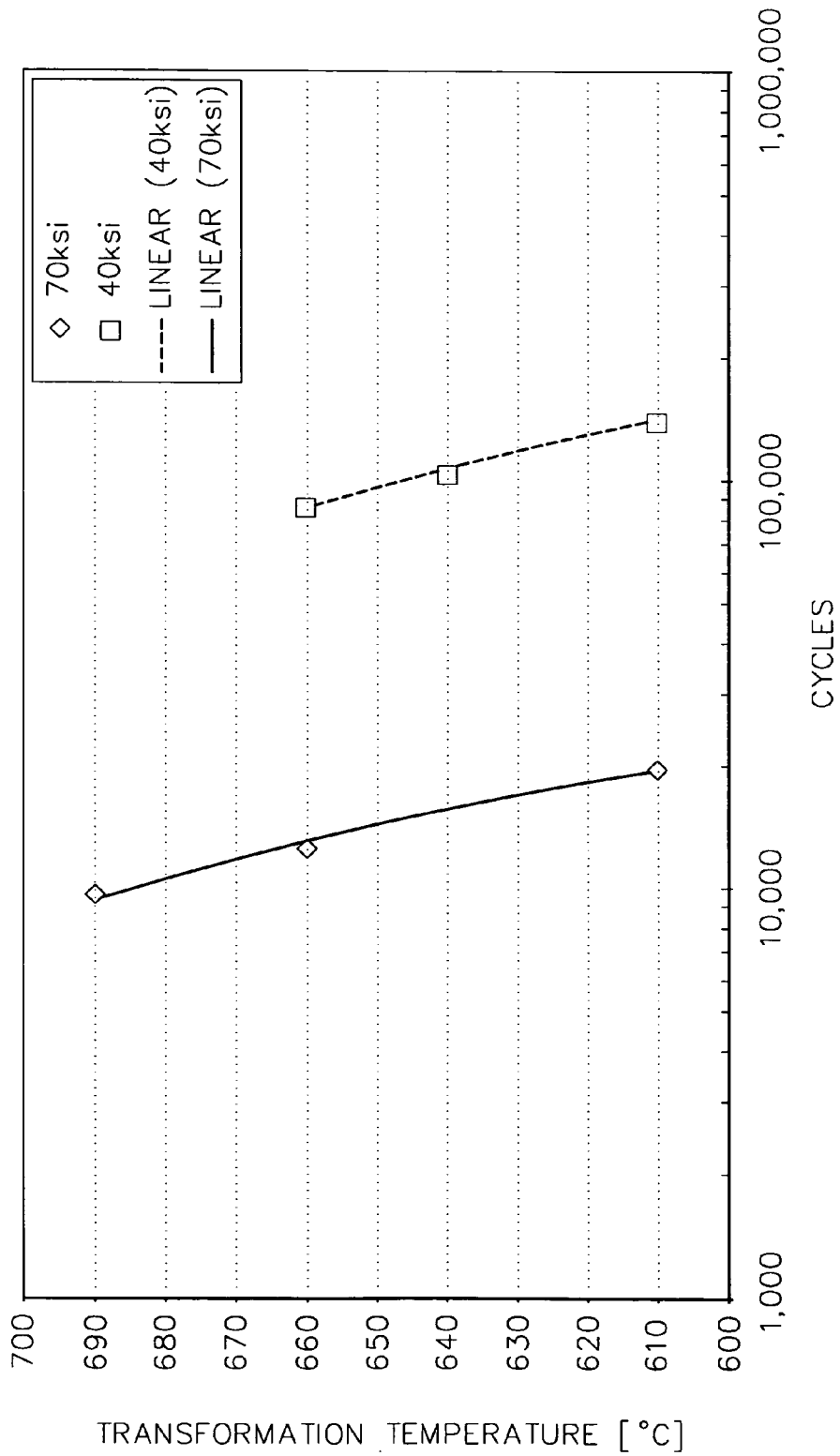
FIG. 4 is a graph of the fatigue life of a titanium alloy foil as a function of transformation temperature in accordance with the present invention.
Figure 5:
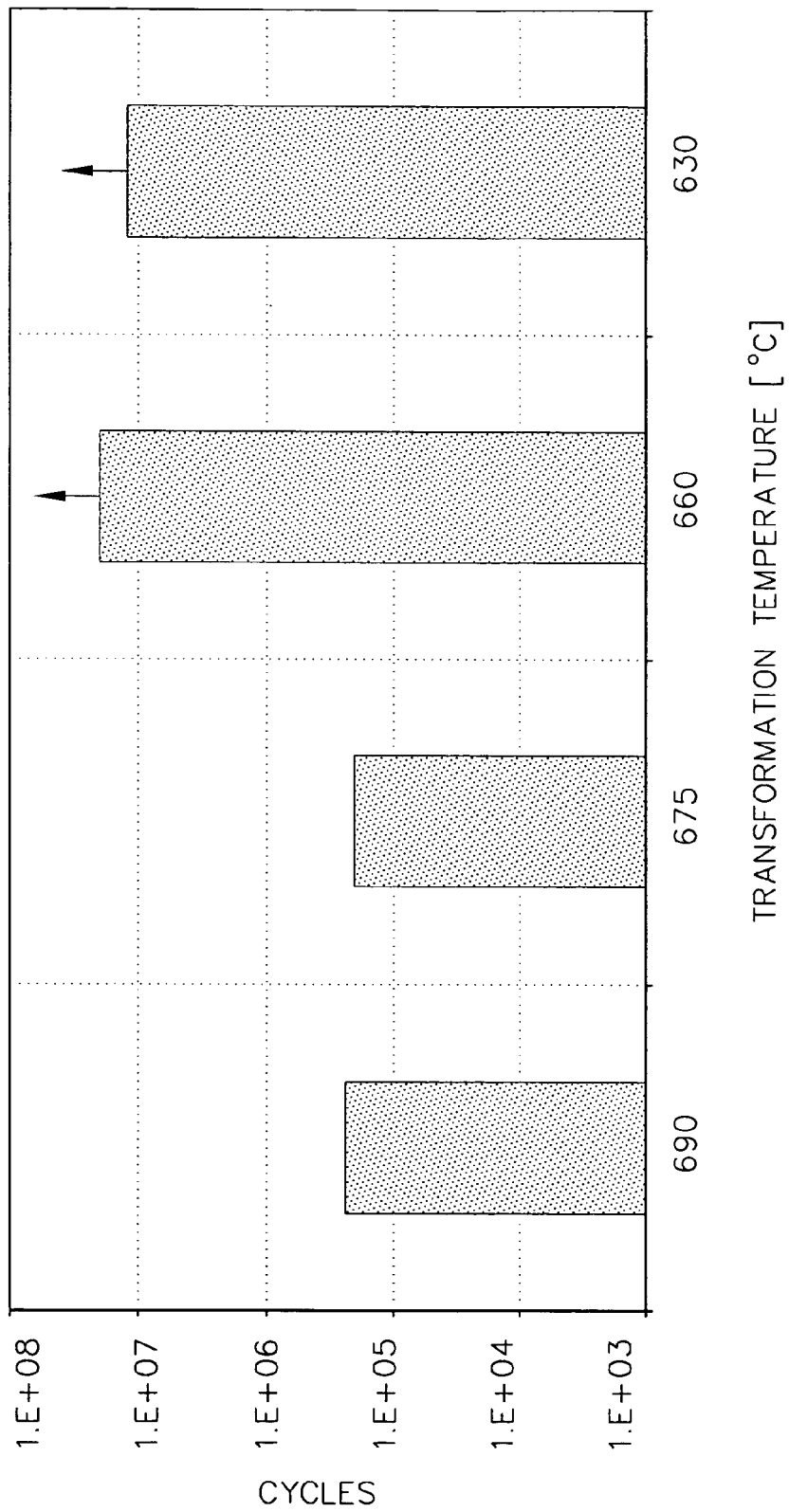
FIG. 5 is a graph of transformation temperature affect on fatigue of a typical titanium alloy foil.

The tensile strength (FIG. 3) shows an increase as the temperature drops from 700 to 640° C., and it then remains relatively constant. The fatigue strength increases as the temperature decreases, surprisingly continuing to increase at the same rate even when the temperature drops below 660° C. In fact, the increase in fatigue life as the temperature falls below 700° C. is surprisingly greater than would be expected from the increase in tensile strength (FIGS. 4–5). Comparable good oxidation resistance was found for all the heat treatment temperatures below around 700° C.

Figure 6:
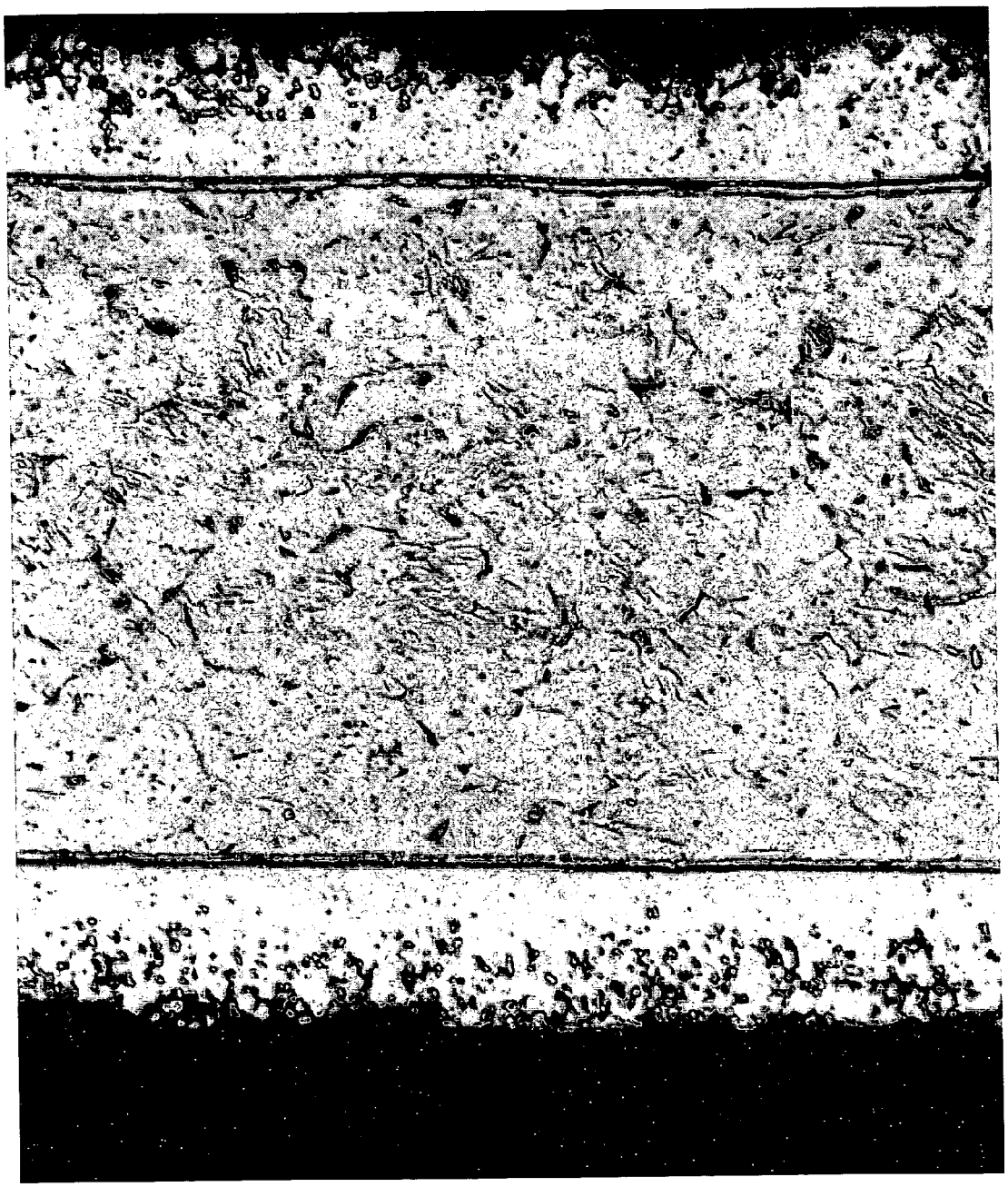
FIG. 6 is a micrograph showing the oxidation coating of the present invention.

It was also surprisingly found that if the diffusion temperature of the coating on the metal substrate was below the melting temperature of the Al, diffusion into the Ti still occurred, provided the coating process produced a good clean bond between the part and the coating. In FIG. 6 a micrograph is shown for a relatively thick ~12 µm protective coating (to better show up the coating) that has been heat treated at a temperature below the melting point of Al. A very thin diffusion or bond layer can however still be seen between the layer of titanium aluminide and the Ti despite the low temperature. At higher temperatures, above the melting point of Al, the outside surface is denser and more clearly defined than in FIG. 6, and the alumina layer is more clearly visible. The micrograph of FIG. 6 shows both surfaces of the Ti foil to illustrate another advantage of the thin Al layer herein described. Thicker layers it can be seen would effectively be comparable in total thickness to the Ti foil, which is undesirable from the point of view of heat exchanger design.

Temperatures below 600° C. give the best properties, but occasional apparent problems of the Al bonding to the Ti base were noticed at temperatures below 630° C. Improved cleaning of the Ti prior to Al deposition may avoid such problems. We found that cleaning of the Ti with, for instance, dilute caustic solution (KOH) can appreciably improve fatigue life, compared to material transformed at the same temperature. It is probable that such improved cleaning would allow the transformation temperature to be reduced below 630° C., while still achieving a good bond. Also, it was noticed that higher vacuum levels increased the problems of the Al bonding to the Ti. This is surprising, but may indicate the desirability of forming alumina prior to bonding and diffusing the Al. It is also possible that the apparent lack of bonding is actually an ideal case with the excess Al being removed as a form of aluminum oxide.

It should be understood, of course, that the foregoing relates to preferred embodiments of the invention and that modifications may be made without departing from the spirit and scope of the invention as set forth in the following claims.

We claim:

1. A coated substrate prepared according to a process comprising the steps of:
   a) depositing an aluminum conversion layer on a surface of a titanium-based substrate;
   b) oxidizing a first portion of the aluminum conversion layer to form an outer alumina layer; and
   c) diffusing a second portion of the aluminum conversion layer into the titanium-based substrate, wherein a titanium aluminide layer is formed beneath the alumina layer and a diffusion layer is formed between the titanium aluminide layer and the substrate, and wherein:
   step b) is performed at a first temperature,
   step c) is performed at a second temperature, the second temperature substantially higher than the first temperature but lower than the melting temperature of aluminum, and
   a thickness of the diffusion layer, the titanium aluminide and the outer alumina layer is about 10 micron or less.

2. The coated substrate of claim 1, wherein the first temperature is about 400° C.

3. The coated substrate of claim 1, wherein step a) is performed at a temperature less than about 550° C.

4. The coated substrate of claim 1, wherein:
   the titanium aluminide layer is formed to a thickness of at least from about 2 microns.

5. The coated substrate of claim 1, wherein the method further comprises:
   d) cooling the coated substrate at a controlled rate, wherein the rate is from about 15 to 60° C. per hour, whereby cracking of the titanium aluminide layer is prevented.

6. The coated substrate of claim 1, wherein the titanium aluminide layer comprises $TiAl_3$.

7. An oxidation protective coating for an uncoated titanium-based alloy substrate for forming a coated substrate, the coating comprising:
   a layer of titanium aluminide, wherein the layer of titanium aluminide comprises $TiAl_3$;
   a layer of alumina ($Al_2O_3$) disposed directly on the layer of titanium aluminide, wherein the layer of alumina has a thickness in the range of from about 0.5 to 5 microns; and
   a diffusion layer disposed between the titanium aluminide layer and the substrate, wherein the oxidation protective coating has a thickness of about 10 micron or less.

8. The oxidation protective coating of claim 7, wherein the yield strength of the coated substrate is similar to the yield strength of the uncoated substrate.

9. The oxidation protective coating of claim 7, wherein the titanium-based alloy substrate comprises foil having a thickness of about 4 mils, and the coated substrate has a yield strength of at least about 140 Ksi.

10. The oxidation protective coating of claim 7, wherein the titanium-based alloy substrate includes a braze disposed on the surface of the titanium-based alloy substrate, the braze comprises titanium, and wherein the oxidation protective coating is formed on the braze, and the yield strength of the coated substrate is similar to the yield strength of the uncoated substrate.

11. The oxidation protective coating of claim 7, wherein the layer of titanium aluminide has a thickness of at least about 2 microns.

12. A titanium-based coated component, comprising:
   a titanium-based substrate; and
   an oxidation protective coating having a uniform thickness disposed on the titanium-based substrate, wherein the oxidation protective coating comprises:
   a layer of titanium aluminide disposed directly on a surface of the titanium-based substrate, wherein the layer of titanium aluminide is formed by heating an aluminum conversion layer at a temperature below that temperature at which aluminum melts, and the layer of titanium aluminide comprises $TiAl_3$; and a layer of alumina ($Al_2O_3$) disposed directly on the layer of titanium aluminide, wherein the layer of alumina has a thickness in the range of from about 0.5 to 5 microns; and a diffusion layer disposed between the titanium aluminide layer and the substrate, wherein a thickness of the oxidative protective coating is about 10 micron or less.

13. The titanium-based coated component of claim 12, wherein the coated component comprises a panel of a heat exchanger.

14. The titanium-based coated component of claim 12, wherein the coated component comprises a braze disposed on the titanium-based substrate, the layer of alumina is disposed over the braze, and the braze includes a solid solution of aluminum.

15. The titanium-based coated component of claim 12, wherein:

the titanium-based substrate comprises foil having a thickness of about 4 mils, and the coated component has a yield strength of at least about 140 Ksi.

* * * * *